US006205408B1

United States Patent
Jubin et al.

(12) United States Patent
(10) Patent No.: US 6,205,408 B1
(45) Date of Patent: *Mar. 20, 2001

(54) CONTINUOUS MONITORING SYSTEM

(75) Inventors: Bradford Tyler Jubin, Peachtree City; Michael Albert Sanchez, Fayetteville, both of GA (US)

(73) Assignee: Semtronics Corporation, Peachtree City, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/482,701

(22) Filed: Jan. 13, 2000

Related U.S. Application Data

(63) Continuation of application No. 08/955,547, filed on Oct. 22, 1997, now Pat. No. 6,052,053.

(51) Int. Cl.[7] .................................................. G08B 21/00
(52) U.S. Cl. ......................... 702/182; 340/540; 340/635; 340/649; 324/557
(58) Field of Search .................................. 702/182, 183, 702/184, 185, 188; 340/540, 635, 649; 324/509, 510

(56) References Cited

U.S. PATENT DOCUMENTS

| 4,638,399 | 1/1987 | Maroney et al. . |
| 4,639,825 | 1/1987 | Breidegam ............................ 361/220 |
| 4,813,459 | 3/1989 | Breidegam . |

(List continued on next page.)

FOREIGN PATENT DOCUMENTS

| 4235379 | 4/1994 | (DE) . |
| 0 590 180 A1 | 9/1992 | (EP) . |
| 0 7275371 | 10/1995 | (JP) . |

OTHER PUBLICATIONS

Various Internet Web Pages at http://www.credencetech.com/Aware.htm, copyrighted 1999.*
EDS Association Advisory No. EDS–ADV1.0–1994 for Electrostatic Discharge Terminology Glossary pp. 1–8 and A1 toC4.
International Application No. PCT/US98/17269 (Dec. 18, 1998); WO99/09792.
International Application No. PCT/US98/14878 (Jul. 17, 1998); WO99/04277.

* cited by examiner

Primary Examiner—Patrick Assouad
(74) Attorney, Agent, or Firm—Michael J. Turton, Esq.; James L. Ewing, IVEsq; Kilpatrick Stockton

(57) ABSTRACT

The present invention provides automated systems for performing electrostatic discharge (ESD) device efficacy monitoring and recording the results for an ESD auditing program. Systems of the present invention comprise at least one ESD device monitoring unit. A communication system allows the monitoring unit to communicate with a central computer which collects, stores and allows the manipulation of the test data. Systems of the present invention are therefore useful in testing the ESD devices, documenting their performance, and controlling access to particular work areas based on testing results.

17 Claims, 12 Drawing Sheets

U.S. PATENT DOCUMENTS

| | | | |
|---|---|---|---|
| 4,710,751 | 12/1987 | Webster | 340/522 |
| 4,724,520 | 2/1988 | Athanas et al. | 364/200 |
| 4,745,519 | 5/1988 | Breidegam | 361/212 |
| 4,785,294 | 11/1988 | Campbell | 340/649 |
| 4,800,374 | 1/1989 | Jacobson | 340/649 |
| 4,859,992 | 8/1989 | Hoigaard | 340/649 |
| 4,961,157 | 10/1990 | Nick et al. | 702/82 |
| 4,974,115 | 11/1990 | Breidegam | 361/231 |
| 5,057,965 * | 10/1991 | Wilson | 361/212 |
| 5,083,117 | 1/1992 | Hoigaard | 340/649 |
| 5,422,630 | 6/1995 | Quinn et al. | 340/661 |
| 5,519,384 | 5/1996 | Chanudet et al. | 340/649 |
| 5,588,119 | 12/1996 | Vincent et al. | 364/242.95 |
| 5,661,657 | 8/1997 | Jordan et al. | 702/108 |
| 5,675,813 | 10/1997 | Holmdahl | 364/480 |
| 5,862,054 * | 1/1999 | Li | 364/468.28 |
| 5,870,698 * | 2/1999 | Riedel et al. | 702/182 |
| 5,903,220 * | 5/1999 | Jon et al. | 340/600 |
| 5,923,160 * | 7/1999 | DeChiaro et al. | 324/72.5 |
| 5,969,626 * | 10/1999 | Maciel | 340/649 |
| 6,052,053 * | 4/2000 | Jubin et al. | 340/540 |

| SMARTHUB | STATION | STATUS | DATE | TIME | DURATION |
|---|---|---|---|---|---|
| COM 1 HUB 0 | (1) TOM | NO OPERATOR | 7/8/97 | 10:43:16 AM | 5 |
| COM 1 HUB 0 | (1) JOHN | NO OPERATOR | 7/8/97 | 10:43:16 AM | 5 |
| COM 1 HUB 0 | (2) ASSEMBLY 1 | NO OPERATOR/MAT PASS | 7/8/97 | 10:43:16 AM | 5 |
| COM 1 HUB 0 | (2) ASSEMBLY 2 | NO OPERATOR/MAT PASS | 7/8/97 | 10:43:16 AM | 5 |
| COM 1 HUB 0 | (1) TOM | OPERATOR PASS/MAT PASS | 7/8/97 | 10:43:18 AM | 5 |
| COM 1 HUB 0 | (1) JOHN | OPERATOR PASS/MAT PASS | 7/8/97 | 10:43:18 AM | 5 |
| COM 1 HUB 0 | (2) ASSEMBLY 1 | OPERATOR PASS/MAT PASS | 7/8/97 | 10:43:18 AM | 5 |
| COM 1 HUB 0 | (2) ASSEMBLY 2 | OPERATOR PASS/MAT PASS | 7/8/97 | 10:43:18 AM | 5 |
| COM 1 HUB 0 | (1) TOM | OPERATOR FAIL AND/OR MAT FAIL | 7/8/97 | 10:43:19 AM | 5 |
| COM 1 HUB 0 | (1) JOHN | OPERATOR FAIL AND/OR MAT FAIL | 7/8/97 | 10:43:19 AM | 5 |
| COM 1 HUB 0 | (2) ASSEMBLY 1 | OPERATOR FAIL AND/OR MAT FAIL | 7/8/97 | 10:43:19 AM | 5 |
| COM 1 HUB 0 | (2) ASSEMBLY 2 | OPERATOR FAIL AND/OR MAT FAIL | 7/8/97 | 10:43:19 AM | 5 |

| NAME | OPERATION STATUS | MAT. STATUS | LAST POLL DATE/TIME |
|---|---|---|---|
| LAB | | | 07/08/97 10:37:05 AM |
| ASSEMBLY 1 | STATUS UNKNOWN | | 07/08/97 10:37:05 AM |
| ASSEMBLY 2 | STATUS UNKNOWN | | 07/08/97 10:37:05 AM |

STATUS AT LAST POLL

FIG. 11

| NAME | FAULT | DATE/TIME |
|---|---|---|
| TOM | OPERATOR FAIL AND/OR MAT FAIL | 07/08/97 10:38:28 AM |
| JOHN | OPERATOR FAIL AND/OR MAT FAIL | 07/08/97 10:38:28 AM |
| ASSEMBLY 1 | MAT FAIL | 07/08/97 10:38:28 AM |
| ASSEMBLY 2 | MAT FAIL | 07/08/97 10:38:28 AM |
| TOM | OPERATOR FAIL AND/OR MAT FAIL | 07/08/97 10:38:28 AM |
| JOHN | OPERATOR FAIL AND/OR MAT FAIL | 07/08/97 10:38:28 AM |
| ASSEMBLY 1 | MAT FAIL | 07/08/97 10:38:28 AM |
| ASSEMBLY 2 | MAT FAIL | |

FAULT LOG: 8

CONTINUOUS MONITORING SYSTEM

RELATED APPLICATION DATA

This application is a continuation (divisional) of U.S. application Ser. No. 08/955,547, filed with the U.S. Patent Office on Oct. 22, 1997 now U.S. Pat. No. 6,052,053.

BACKGROUND OF THE INVENTION

Static electricity creates problems in the electronics and other industries, particularly with the advent of integrated circuits and other microelectronic components. Components such as integrated circuits, for instance, may be disabled or destroyed by over-voltages or power density resulting from the discharge of static electricity. Certain junctions in such circuits can be destroyed by overvoltages as low as 25 volts, which radically changes the doping structure in their lattices. Power densities resulting from excessive potential and imperfections in circuit layout or structure can vaporize or radically alter the silicon substrate and thus impair or destroy a circuit's performance. Yet a person walking on carpet on a dry day can accumulate as much as 30,000 volts, and he or she can triboelectrically generate thousands of volts by simply changing his or her position in a chair or handling a styrofoam cup.

Such a person can inadvertently discharge such static potential into a circuit or component by touching it and causing over-voltage or excessive power density. Additionally, the potential in such a person's body can induce a charge in a circuit that can later cause over-voltage or excessive power density when the circuit is subsequently grounded.

Those in industries in which integrated circuits and other microelectronic components are handled or assembled may take measures to limit the failure rate of those circuits and components by attempting to keep them as well as their environment at zero electrical potential. Such measures include providing workers and work stations with electrostatic discharge (ESD) devices, such as antistatic carpet, conductive or dissipative grounded desk top work surfaces, hot air ion generators which emit ions to neutralize static changes, grounding wrist straps, heel grounders and other garments to keep workers at zero potential.

The situations in which grounding wrist straps are used heighten the importance of their being effective, reliable, and predictable. The person working on microelectric components or integrated circuits may be completely unaware that he or she has accumulated static electrical charges, and may therefore unknowingly be in a position to disable circuits on which he or she is working or which he or she is handling. If the wrist strap is loose or has been removed or if it is not functioning properly for other reasons, the worker may be unaware that electrical discharges transmitted from his or her fingers are disabling the circuits. (A typical person cannot sense a static electrical discharge of less than approximately 3,500 volts.) No one may discover that the circuits have been disabled or damaged until hours, days or weeks later, when the circuits have been placed in components or devices which fail in the field. Removal and repair or replacement of these circuits once in the field is far costlier than avoiding potential failure while the worker is handling the circuits.

Various procedures for ensuring the proper use and efficacy of ESD devices have been developed. For instance, wrist strap or heel grounder testers have been developed which allow a worker to verify the efficacy of the device. These testing units may be used to continuously monitor the efficacy of the ESD device. Thus, each work station may be equipped with an ESD device monitor which continuously monitors the efficacy of one or more ESD devices and warns the worker in the event of a failure.

Such testing units are of little value, however, if they are not used in a manner which creates confidence that the ESD devices are being tested in a manner that ensures reliable function. Thus, protocols may be established for auditing the monitoring of the ESD devices. For instance, industry standards, such as ISO 9000, may require that manufacturers document any claims that their workers use and verify the efficacy of ESD devices. Thus, where continuous monitoring is used, a record must be made of each occasion on which the failure of an ESD device is detected. These records are then used to certify the products under the applicable standard. Other industry standards or internal operating procedures also may require documentation of ESD auditing programs.

One problem created by conventional methods for recording and tracking of ESD auditing programs is the generation of large amounts of printed documents or records. While such documentation is required, the records can be so bulky and voluminous as to make them practically useless for analytical purposes. Thus, in order to provide the data that can be used in meaningful ways, the records must be entered by hand into a computer database—an expensive and time consuming process. Furthermore, maintaining such records by hand can introduce errors resulting from mis-recording or worker inattention. This is particularly true where continuous monitoring is required, as brief interruptions in ESD device operation may go unnoticed.

Another limitation of manual data entry is the lack of real-time availability of the data to the program supervisor. Currently, if a supervisor wishes to determine whether all ESD devices are operating properly, he or she must go to each testing station and examine the monitoring device and the log book. In a large fabrication facility, the examination of each work station may be difficult or even impossible to do in a short time. Thus, a supervisor has no way of determining which ESD devices are functioning properly at any given time.

In the past, efforts have been made to connect continuous monitoring stations to a central monitoring system. These efforts were unsuccessful, because there was no way to control the flow of data from the continuous monitoring stations to the central monitoring system — data from multiple stations "collided" on its way to the central system, resulting in garbled, and therefore useless, data. Thus, it would be desirable to provide a system for continuously monitoring the efficacy of ESD devices which allows the monitoring data to be collected and analyzed in a central location in a real-time or virtually real-time manner.

SUMMARY OF INVENTION

The present invention provides automated systems for performing continuous monitoring of ESD devices and recording the time and duration of any ESD device failures for an ESD auditing program. Systems according to the present invention comprise at least one ESD device monitoring station. The monitoring station may provide functionality for identifying a work station and each of the ESD devices being used at that station. A communication system allows the testing unit to communicate with a central computer or processor which collects, stores and allows the manipulation of the test data.

The worker connects his or her ESD device into a monitor provided at the workstation. Other ESD devices associated with the workstation may also be connected to the monitor. The monitor provides a continuous indication of the status of the ESD devices. In the event of a device failure, the monitor may present an audible and/or visual alarm to the worker. The worker may then take corrective action as appropriate. At the same time, a central computer continuously polls a hub connected to one or more monitors and displays the status of the ESD devices. In the event of an ESD device failure, data relevant to the failure, such as time and duration, is recorded in a log. Thus, a supervisor may monitor the ESD devices in real time and detailed records of any failures over a given period of time may be recorded.

Automated auditing systems of the present invention present several advantages over the conventional method of performing and documenting the monitoring of ESD devices. The automated system eliminates the bulky and voluminous logs associated with a manual recordation system. Furthermore, because the data is recorded on a central device, the likelihood of lost logs and the need for a separate log at each monitoring station is eliminated. The worker need not even record the failure, but may instead devote his or her time to correcting the problem. These factors combine to increase worker productivity and reduce production costs, particularly documentation costs.

The automated systems can record all data required by documentation standards, such as ISO 9000. Reports required by such standards may be produced automatically without the need for incorporating bulky log books into the documentation or manually inputting data from log books into an electronic format. Thus, documentation processing requirements are dramatically reduced. The automated system also reduces or eliminates worker errors in recording of failures. Moreover, a supervisor may instantly confirm that each ESD device is functioning properly without having to go to each work station and review a paper log.

Accordingly, it is an object of the present invention to provide automated systems for remotely and continuously monitoring the status and efficacy of one or more ESD devices.

It is a further object of the present invention to provide automated systems for remotely and continuously monitoring the status and efficacy of ESD devices, allowing analysis and manipulation of the data acquired thereby, and eliminating the need for voluminous hard-copy records while providing the reports required under applicable manufacturing standards.

It is a further object of the present invention to provide automated systems for remotely and continuously monitoring the status and efficacy of ESD devices which allows instant access to ESD auditing program records at a central location.

It is a further object of the present invention to provide automated systems for remotely and continuously monitoring the status and efficacy of ESD devices which collects and formats test result data in a predetermined manner.

It is a further object of the present invention to provide automated systems for remotely and continuously monitoring the status and efficacy of ESD devices which reduces the time associated with performing and recording the results of the monitoring program.

It is a further object of the present invention to provide automated systems for remotely and continuously monitoring the status and efficacy of ESD devices which allows the status of all such devices to be observed from a central location in real-time.

Other objects, features and advantages of the present invention will become apparent with reference to the remainder of this document.

BRIEF DESCRIPTION OF THE DRAWINGS

FIG. 4 shows a database interface for the system of FIG. 1

FIG. 10 shows a display for displaying monitoring data collected by the system of FIG. 1.

FIG. 11 shows a display for displaying monitoring data logged by the system of FIG. 1.

DETAILED DESCRIPTION

Figure 1:
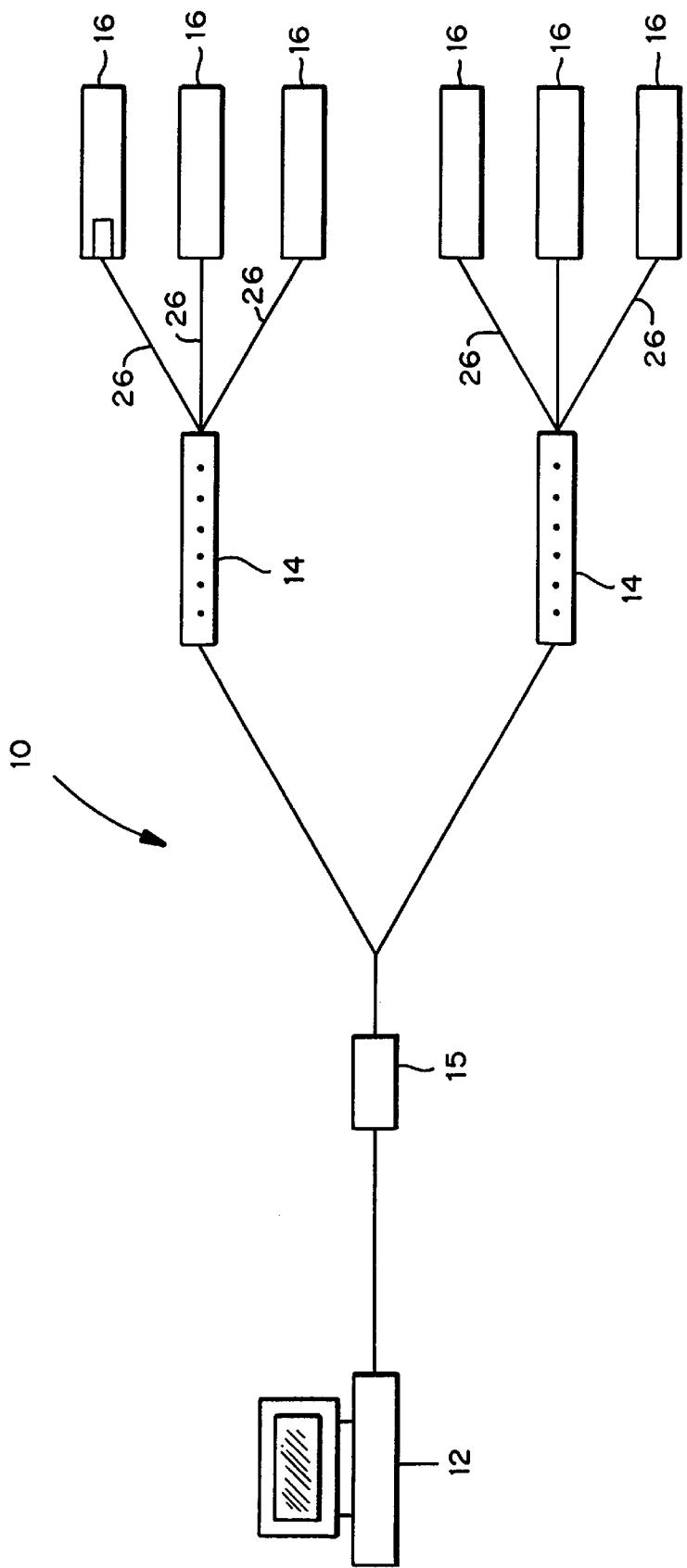
FIG. 1 is a functional block diagram which represents the topology of a first embodiment of an continuous monitoring system according to the present invention.
Figure 2:
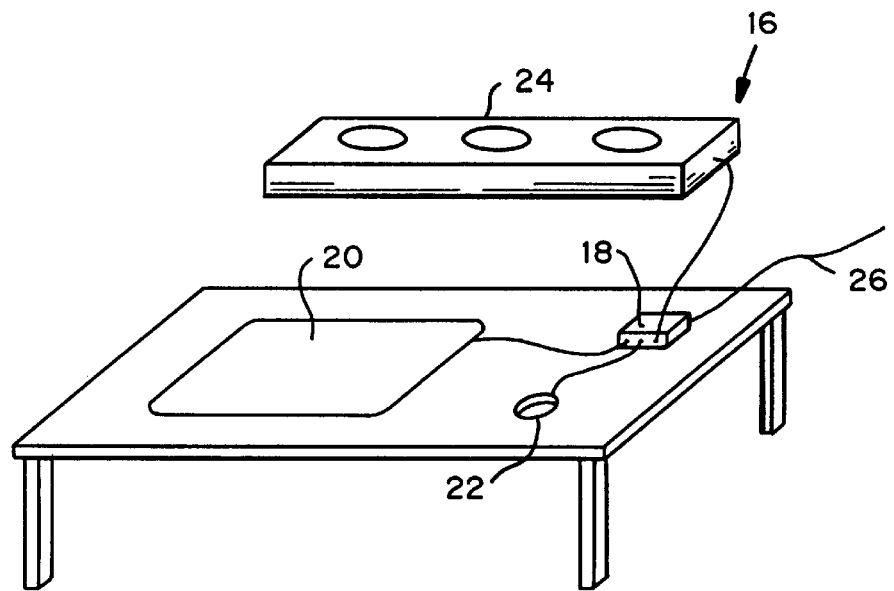
FIG. 2 illustrates a work station connected to the system of FIG. 1.

FIGS. 1–17 show an illustrative embodiment of a system 10 for continuously monitoring ESD devices in accordance with the present invention. Monitoring system 10 comprises computer 12, one or more data hubs 14 and one or more workstations 16.

Computer 12 may be any commercially available general purpose computer. Computer 12 may also be custom built as desired or appropriate. Data hub 14 acts as a temporary storage node for data collected from one or more workstations 16. Data hub 14 may have one or more channels or ports for receiving data. Data hub 14 and workstation 16 may communicate via a serial, parallel, master/slave (polling) or other protocol as desired or appropriate.

Data hub 14 has sufficient memory to store data collected over a predetermined period of time—the actual amount of memory provided may vary as appropriate to the usage and polling rates anticipated for the particular user. Data hub 14 also has a clock which is used to time-stamp incoming data. In this manner, data evidencing the failure of an ESD device may be stamped with the time and duration of the event. Data hub 14 may transmit and receive data from computer 12. Transmission from data hub 14 to computer 12 may be controlled by computer 12 in order to avoid data "collisions" from multiple data hubs 14. In the illustrated embodiment, data hub 14 transmits and receives data using the RS485 protocol. Communications with computer 12 are in the RS232 protocol. Thus, a RS485 to RS-232 converter module 15 such as that described above may be provided to allow communication between computer 12 and data hub 14.

Workstation 16 may be any production area, manned or automated, in which ESD devices are in use. Workstation 16 comprises continuous ESD device monitor 18 and one or more ESD devices, such as static mat 20, wrist strap 22 and ion generator 24. Other ESD devices may be employed at workstation 16 as appropriate. Each of the various ESD devices may be connected to monitor 18 while workstation 16 is in use or may otherwise communicate with data hub 14.

Monitor 18 contains one or more (depending on the number of ESD devices to be used) resistive loop, capacitive or other ESD device testing circuits. The test circuits of monitor 18 are always energized and thus continuously monitor the status of the devices connected thereto. Monitor 18 may have visual and/or auditory alarms which alert the worker anytime that any of the devices are not performing properly. The alarms may be varied with respect to each ESD device in use so as to allow the worker to quickly identify the source of the problem. For example, if a wrist strap and a static mat are both in use, monitor 18 may have one LED display marked "wrist strap" and another marked "static mat," each of which displays the status of the corresponding device. Monitor 18 is also capable of generating one or more data signals, each signal corresponding to the status of a particular ESD device. Thus, a monitor 18 having a static mat 20 and a wrist strap 22 may generate distinct signal indicating the failure of one or both of these devices should such an event occur. This data is directed to output line 26.

A work area may have one or more workstations 16. Monitor 18 of each workstation 16 is connected, via line 26, to data hub 14. Whenever a failure or other event is detected, monitor 18 sends the appropriate signal to data hub 14. For instance, a signal may be sent whenever a worker connects or disconnects his or her wrist strap. Similarly, if an ESD device fails, a "fail" signal may be directed to data hub 14. The fail signal continues until the failure is corrected. Alternatively, the signal may be stored by monitor 18 and periodically retrieved by data hub 14. In either case, data hub 14 stores the information, including the time and duration of the event and the channel over which the signal was received (as discussed in more detail below), in a memory.

Computer 12 periodically polls data hub 14 and retrieves the event data recorded in the memory of data hub 14. Computer 12 generates a display of the status of each workstation 16. The polling rate may be very high, e.g., once per second, to generate a virtually continuous, real-time display of work station status. Of course, the polling rate may be less frequent, updating the display at any rate desired by the operator. The polling rate may be selected to reflect the monitoring requirements of the particular facility and processes. Computer 12 also stores the data for future use and manipulation.

Figure 3:
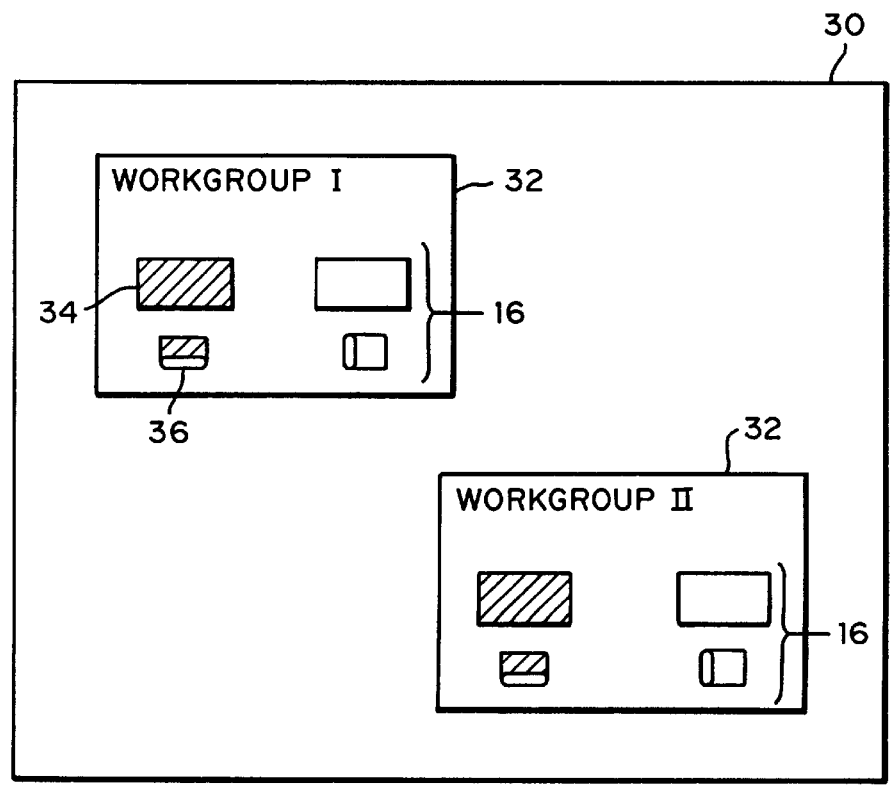
FIG. 3 shows a graphical display used to display information gathered by a continuous monitoring system according to the present invention.

Software is provided for computer 12 which provides a graphical display of workstation status and, in addition, data summaries similar to those described for the first embodiment. As illustrated in FIG. 3, display 30 of the software may provide an indication of the status of one or more workgroups 32, each of which is made up of one or more work stations 16. Each workstation 16 may be represented by a multi-part icon in which each part of the icon represents an ESD device. Thus, the icon may include a desktop 34, representing an anti-static mat and a chair 36, representing a wrist strap.

Each icon may be displayed in different colors or patterns, each color or pattern representing a particular status. For example, a red desk may represent a mat failing high (i.e., excessive resistance), a yellow desk might signify a fail-low (i.e., insufficient resistance), green might represent a properly operating mat. Similar color schemes may be used to represent status of other devices. Also, the display may be manipulated in other ways to present other types of information. For instance, the chair icon may be shown in different positions to reflect the presence of absence of a worker. Since the wrist strap is used on the workers person, his or her presence may be inferred by the presence or absence of a wrist strap signal.

The manner in which information is displayed and stored may be programmed by the user. For example, as shown in FIG. 4, the software may provide a database structure which allows information for each data hub 14 to be stored and viewed (in FIG. 4, data for only one data hub 14, i.e. corn 1 hub 0, is displayed). For each data hub 14, each workstation 16 connected to that data hub 14 may be listed. Furthermore, status data 38 and other relevant data such as the date 40, time 42 and duration 44 of an event may be stored and displayed.

Figure 5:
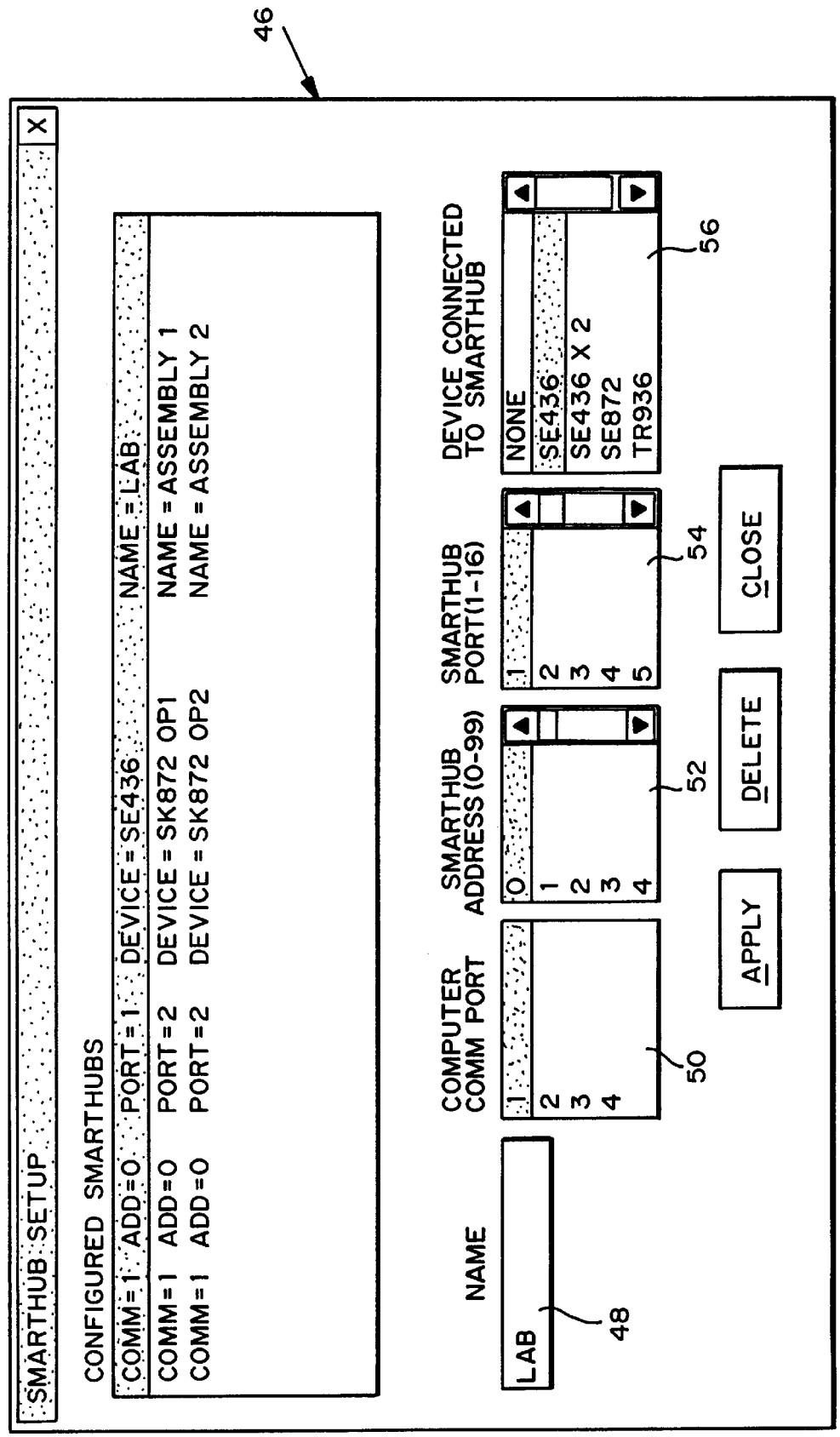
FIG. 5 shows a data hub configuration interface for the system of FIG. 1.
Figure 6:
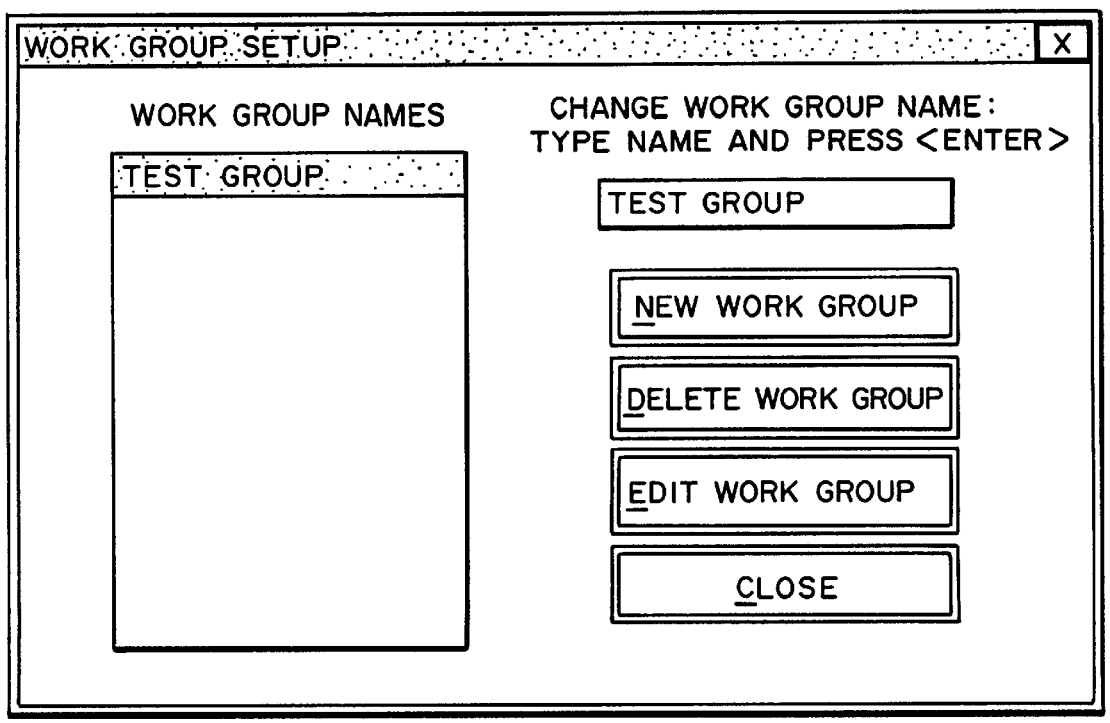
FIG. 6 shows a work group configuration interface for the system of FIG. 1.

In order to present the desired data, a user may configure the software using a series of configuration interfaces as illustrated in FIGS. 5–6. FIG. 5 illustrates a data hub configuration screen 46. Each data hub 14 may be named (see field 48) as desired by the user. For instance, the data hub in a lab may be named "Lab," the data hub in a workshop may be named "Workshop," etc. The communication port of computer 12 to which data hub 14 is connected may be selected (field 50), as well as the address of the data hub (field 52). The address function allows multiple data hubs 14 to be connected to a single comm port.

Each data hub 14 has a plurality of ports or data channels which allow multiple ESD devices to be monitored thereby. The user may select each channel or port (field 54) and assign a particular type of device (field 56) to that port. For instance, port 1 of a data hub 14 may be connected to a monitor 18 which monitors an anti static mat, a wrist strap and an ionizer. Data from monitor 18 is transmitted to port I of data hub 14 and encoded to reflect the nature of the event being reported. Alternatively, each ESD device may transmit data to a separate port of data hub 14. For example, port 1 of data hub 14 may be assigned to the mat, port 2 to the wrist strap and port 3 to the ionizer. The user identifies each of these devices on the computer so that the data transmitted from the monitor to the data hub and ultimately to the computer need only indicate status. Because the program "knows" which device is connected to each port, no device specific data need be transmitted, thus conserving bandwidth. The only data transmitted need be the occurrence and duration of an event. Also, both methods of connecting ESD devices to data hub 14 may be combined. For instance, wrist straps and mats may be connected through the monitor 18 while ionizers connect directly to data hub 14, i.e., the ionizers would have on-board monitors or other systems for detecting and transmitting ionizer status. Any mixture of connection schemes and ESD devices may be selected as desired.

Of course, the system may also be configured such that each device, monitor or data hub transmits device identifying data to the computer in order to simplify configuration. Such data may be transmitted once, during system initialization, periodically at predetermined interval or whenever status data is transmitted.

Once the software is configured to recognize the data it receives from the various data hubs 14 which are connected to the computer 12, the user may create "work groups" or subsets within the data structure which reflect the work environment being monitored. As shown in FIG., 6, the user may create new work groups or delete or edit existing ones.

Figure 7:
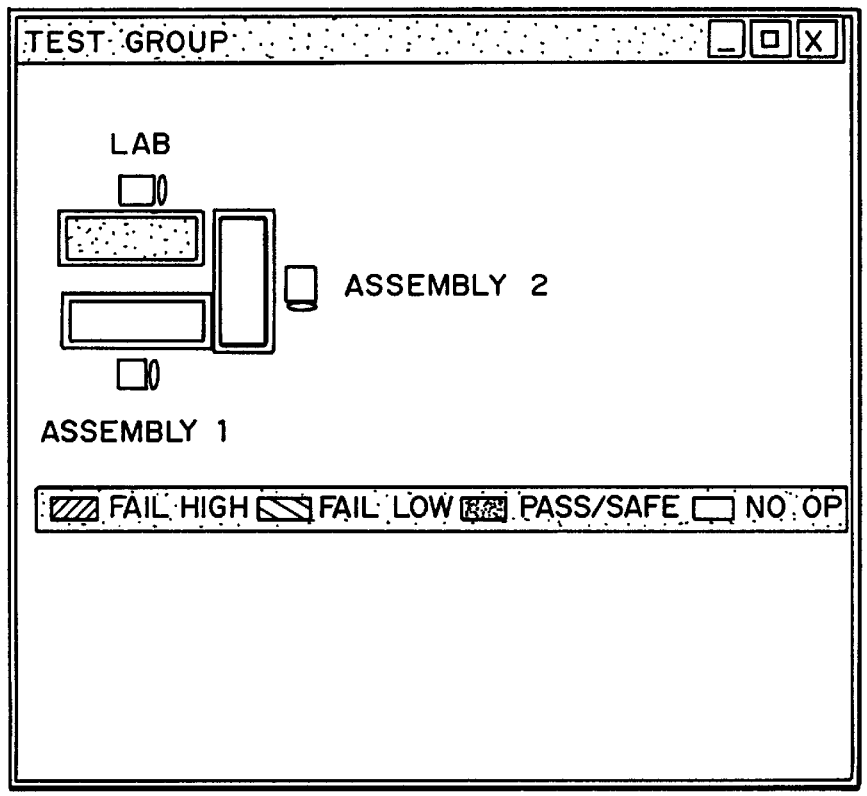
FIG. 7 shows a graphical display for displaying monitoring data collected by the system of FIG. 1.
Figure 8:
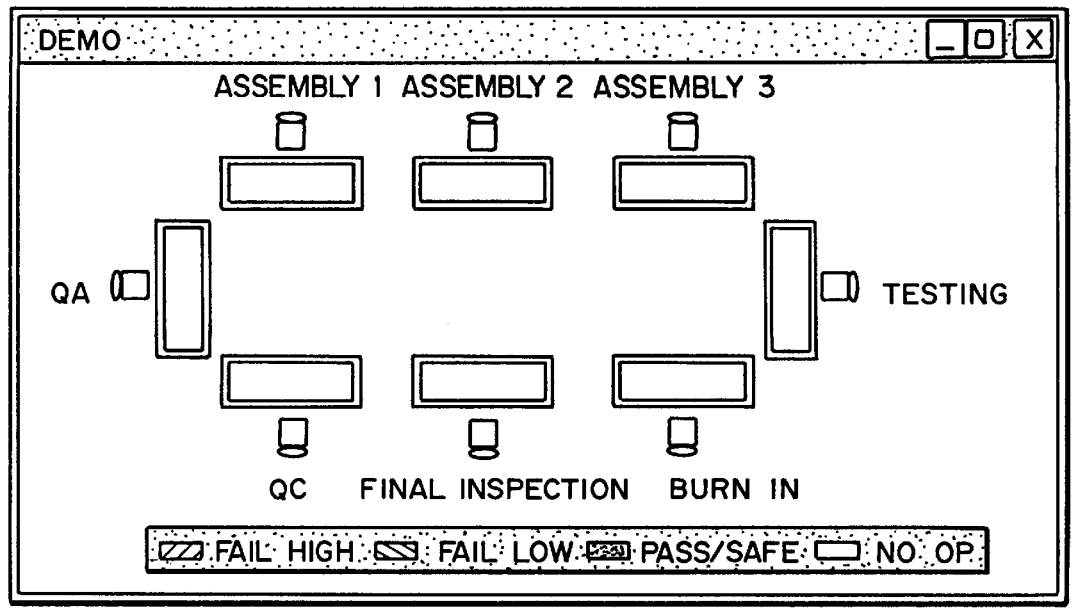
FIG. 8 shows a graphical display for displaying monitoring data collected by the system of FIG. 1.

To create a work group, the user names the groups and assigns to that group selected data hub ports. The ports may be selected in any structure meaningful to the user. For instance, one work group may be all of the ESD devices in a given work area. Thus, if ports 1 through 6 of a given data hub are assigned to three desks in a work area, those ports (1–6) may be assigned to one work group. As shown in FIG. 7, the three desks may be graphically represented on the computer's display. As noted above, the icons reflect the status of the ESD devices in use at each workstation. As shown in FIG. 8, any number of workstations can be assigned to a work group. As shown in FIG. 3, multiple work groups may be displayed simultaneously. The icons can be positioned in the display to reflect the actual physical location of the workstations relative to each other.

Figure 9:
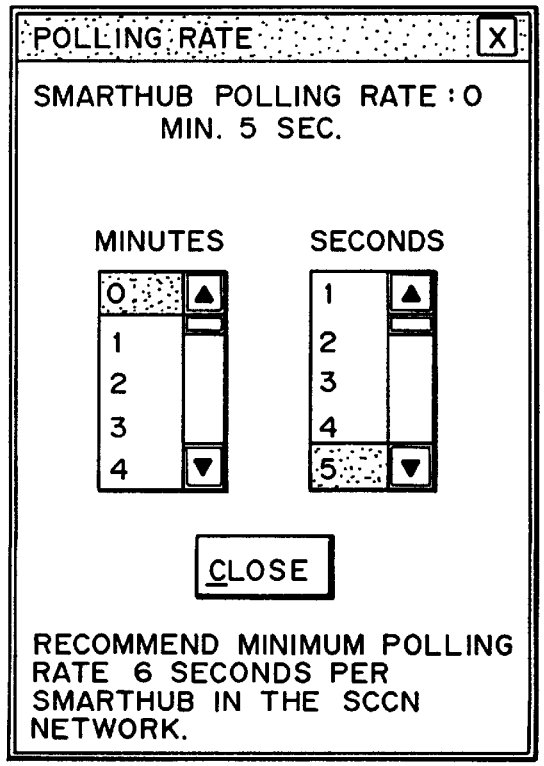
FIG. 9 shows a polling rate selection interface for the system of FIG. 1.

The user may also set the polling rate of the system, as shown in FIG. 9. It may be desirable to have very frequent polling, thus allowing virtually real-time monitoring of the ESD devices.

Data retrieved from data hubs 14 may be displayed in several ways. In addition to the iconic representations described above, the data may be displayed in textual form. For instance, as shown in FIG. 10, the status of each device as of the last poll may be displayed as text. Similarly, as shown in FIG. 1 1, historical data may be stored and displayed as text.

Figure 12:
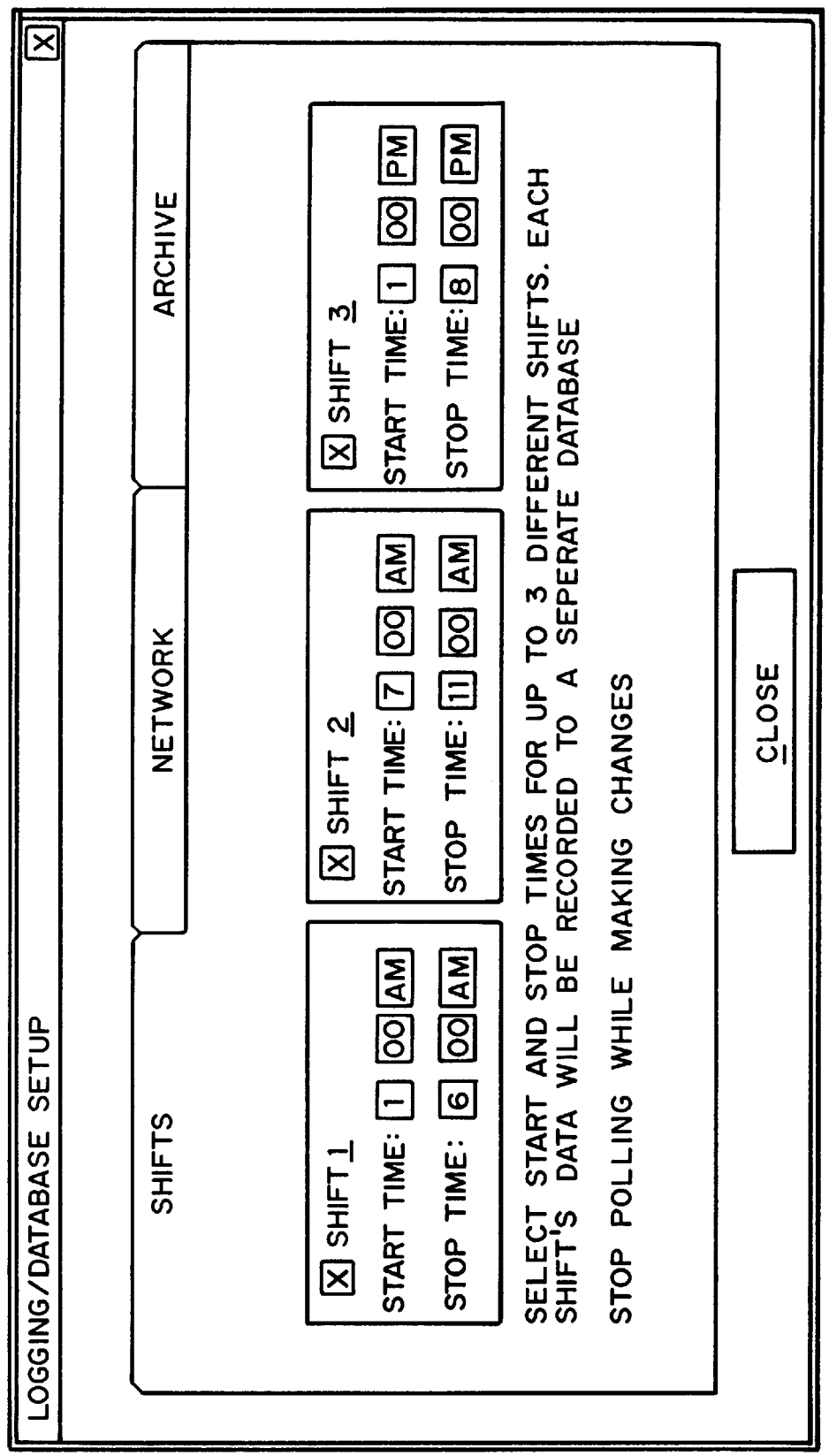
FIG. 12 shows a interface for configuring the database created by the system of FIG. 1.
Figure 13:
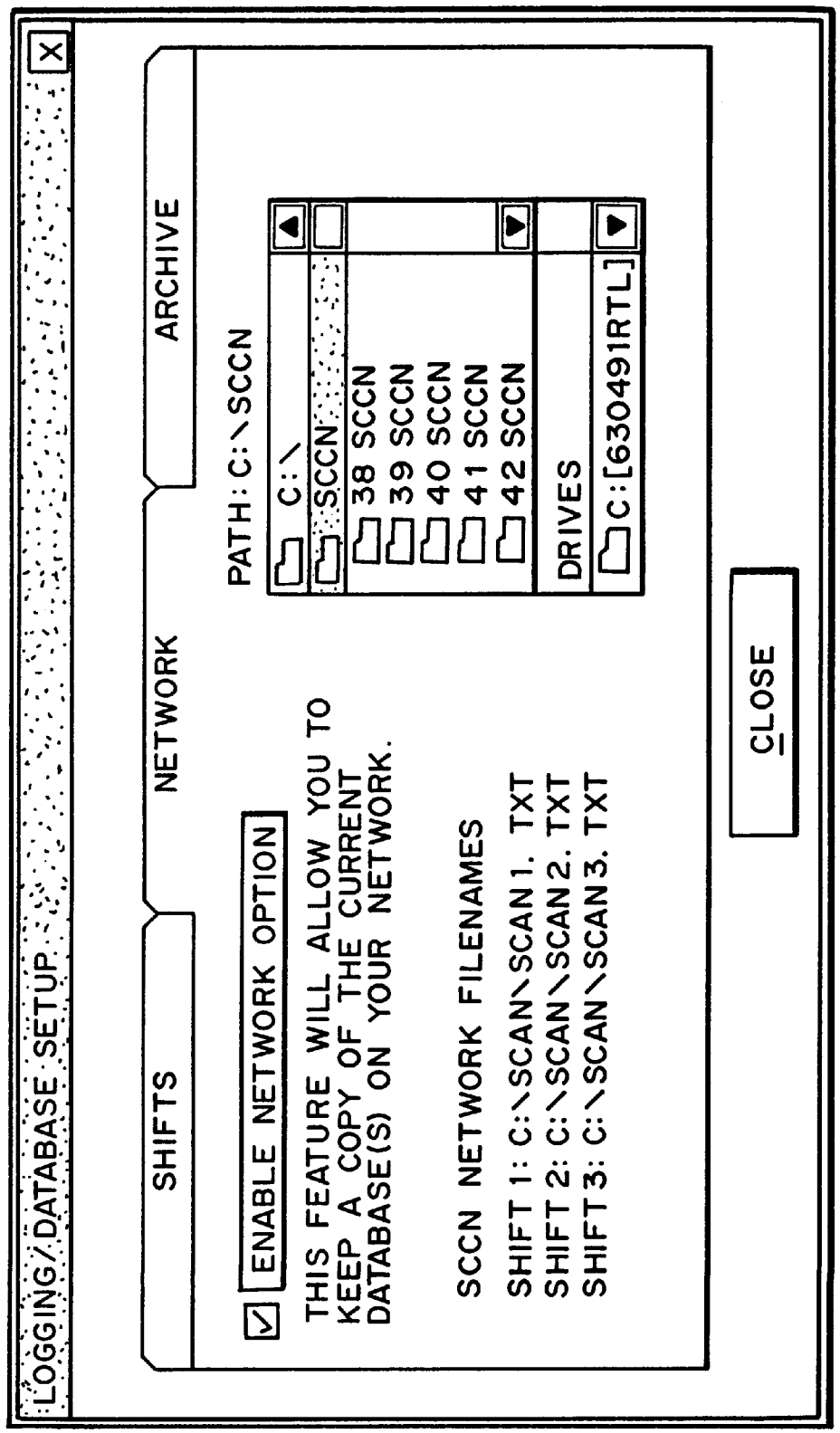
FIG. 13 shows an interface for copying the database created by the system of FIG. 1.
Figure 14:
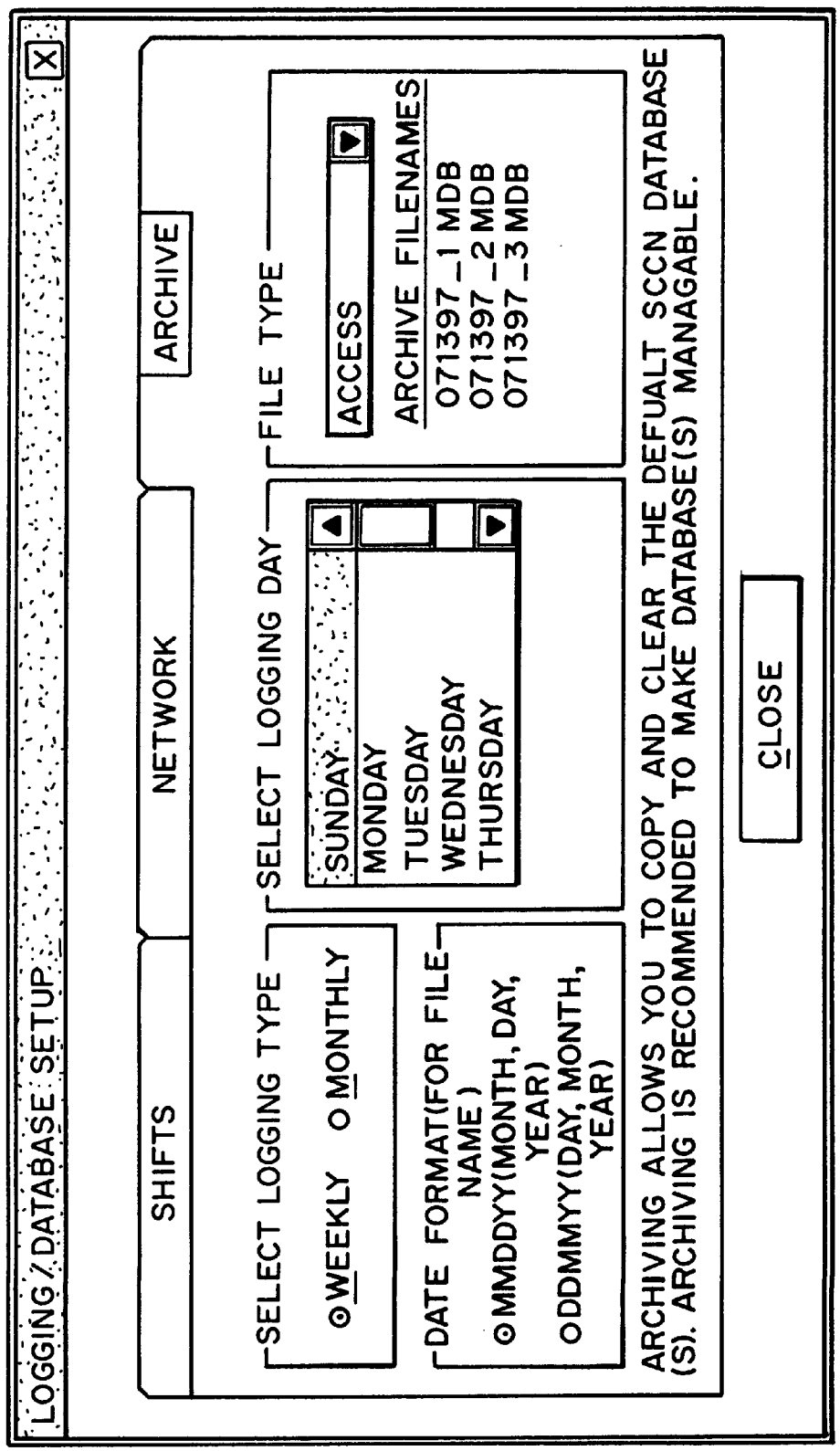
FIG. 14 shows an interface for archiving the database created by the system of FIG. 1.

The historical data may be collected and preserved for later use in one or more data archives. As shown in FIG. 12, the software may be configured to create databases which include all historical data recorded in a predetermined block of time or "shift." A standard three shift day may be used or alternative shift structures may be used depending on the user's needs. As shown in FIG. 13, the user can configure the software to automatically copy the database for each shift to a predetermined location. Because the size and number of databases can grow rapidly, it may be desirable to periodically archive the data in a new location—such as a high capacity storage device. As shown in FIG. 14, the software may be configured to periodically archive the data to a desired location.

Figure 15:
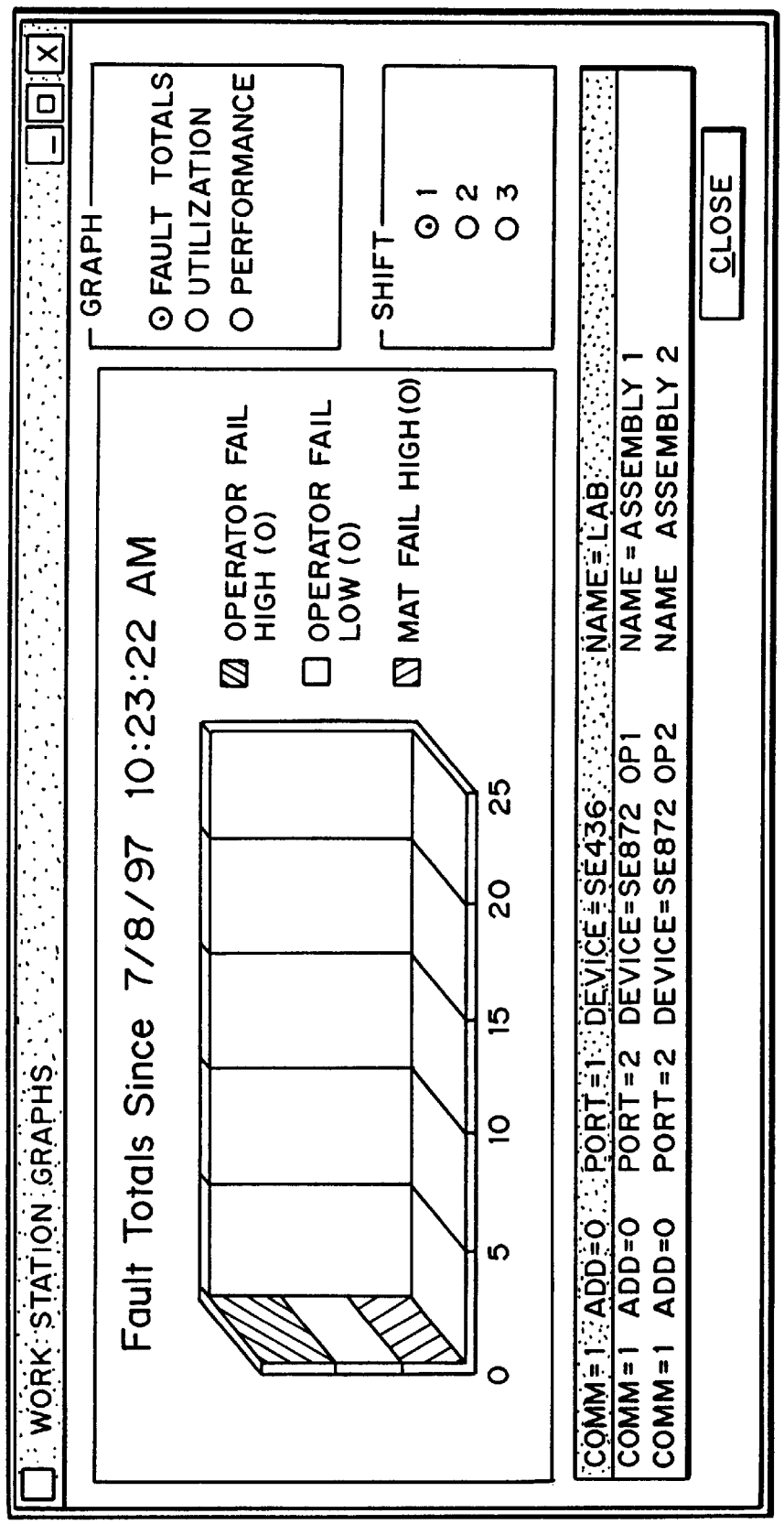
FIG. 15 shows a graphical display for displaying the data collected by the system of FIG. 1.
Figure 16:
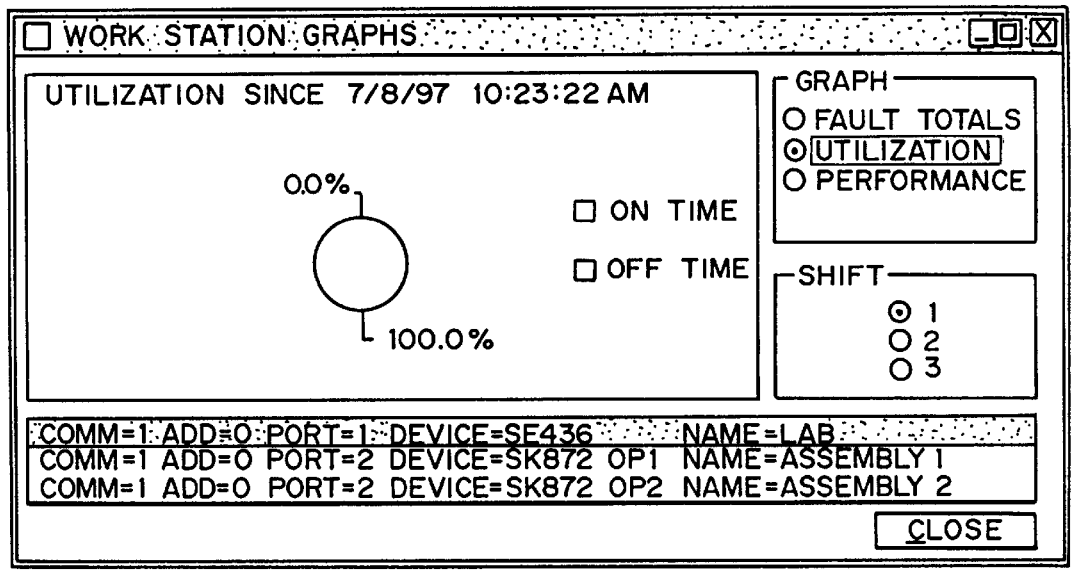
FIG. 16 shows a graphical display for displaying the data collected by the system of FIG. 1.
Figure 17:
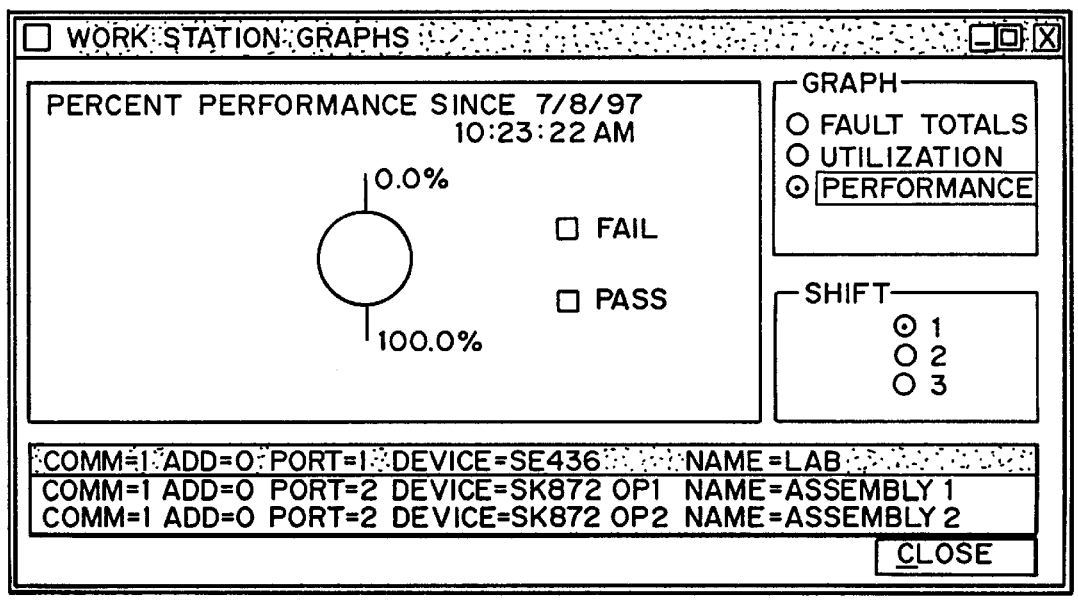
FIG. 17 shows a graphical display for displaying the data collected by the system of FIG.1.

As shown in FIGS. 15–17, historical data can be displayed in graphical form to allow better comprehension of the data and historical trends. FIG. 15 shows a bar graph display which allows the user to review all detected fault conditions for each ESD device and for each shift. The graph may differentiate between types of fault conditions, such as "fail high" and "fail low." FIG. 16 and show pie chart displays which detail device utilization and performance respectively. These data may be charted for each device and for each shift. Of course, other criteria, data ranges and formats may be displayed as desired and appropriate.

Systems 10 according to the present invention, accordingly, may include a number of static control related sensors which may be connected in a number of ways to processors. The processors automatically and, if desired, continuously monitor particularized static control requirements for wrist straps and other devices. The processors then store, process, communicate and document results of the monitoring program. Although the foregoing is provided for purposes of illustrating, explaining and describing one of such systems in particular detail, modifications and adaptations to the described systems and other embodiments will be apparent to those skilled in the art and may be made without departing from the scope or spirit of the invention.

What is claimed is:

1. A method for monitoring the efficacy of at least one electrostatic discharge (ESD) device comprising the steps of:
   A. continuously monitoring the ESD device for an event with at least one of a plurality of monitoring units;
   B. transmitting data signals representing the event to a data hub;
   C. storing the data signals as event data at the data hub; and
   D. transmitting the event data to a computer.

2. The method of claim 1 further comprising the step of storing the event data in a database.

3. The method of claim 1 further comprising the step of periodically archiving the event data.

4. The method of claim 1 further comprising the step of graphically displaying the event data.

5. The method of claim 1 in which the step of transmitting event data is performed with sufficient frequency so as to provide a virtually real-time visual display of the status of the ESD devices.

6. The method of claim 3 further comprising the step of periodically formatting the archived event data in a manner prescribed by an ESD auditing program reporting standard.

7. The method of claim 2 further comprising the step of graphically displaying the event data from the database.

8. A system for continuously monitoring the efficacy of electrostatic discharge (ESD) (ESD) devices comprising:
   A. at least one ESD device monitoring unit electrically coupled to at least one ESD device, the monitoring unit adapted to continuously monitor the ESD device for an event;
   B. at least one data hub having a clock and a memory, the data hub being in communication with the monitoring unit, and adapted to receive data signals representative of an event from the monitoring unit and store the data signals as event data in the memory;
   C. a computer in communication with the at least one data hub, the computer adapter to receive event data.

9. The system of claim 8 in which the computer is further adapted to download, format, and display the event data.

10. The system of claim 8 in which the at least one data hub further comprises:
    A. a plurality of channels for receiving data signals; and
    B. at least one channel for transmitting event data.

11. The system of claim 10 in which the at least one data hub further comprises a clock.

12. The system of claim 8 in which the monitoring unit comprises:
    a) at least one monitoring circuit;
    b) an alarm connected to the at least one monitoring circuit; and
    c) an output channel in communication with the at least one monitoring circuit and at least one data hub.

13. The system of claim 8 in which the computer is further adapted to poll the data hub.

14. The system of claim 13 in which the computer is further adapted to provide a graphical interface for presenting a virtually real-time display of the event data retrieved from the data hub.

15. The system of claim 14 in which the computer further comprises a database for storing the configuration of the at least one data hub.

16. The system of claim 15 in which the computer further comprises a database for storing the event data retrieved from the at least one data hub.

17. The system of claim 16 in which the computer is further adapted to associate the configuration with the event data.

* * * * *